US008228455B2

(12) United States Patent
Yang et al.

(10) Patent No.: US 8,228,455 B2
(45) Date of Patent: Jul. 24, 2012

(54) EXPOSING DEVICE, METHODS FOR FORMING PATTERN, CHANNEL, AND HOLE BY USING THE SAME, AND LIQUID CRYSTAL DISPLAY DEVICE THEREWITH AND METHOD FOR FABRICATING THE SAME

(75) Inventors: Joon Young Yang, Bucheon-si (KR); Jung Il Lee, Anyang-si (KR); Jeong Oh Kim, Seoul (KR); Yu Kyeong Ahn, Seoul (KR); Young Kwon Kang, Suwon-si (KR); Sang Jin Lee, Gunpo-si (KR); Jung Ho Bang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 626 days.

(21) Appl. No.: 12/256,840

(22) Filed: Oct. 23, 2008

(65) Prior Publication Data
US 2009/0109364 A1  Apr. 30, 2009

(30) Foreign Application Priority Data
Oct. 29, 2007  (KR) .................. 10-2007-0108674

(51) Int. Cl.
G02F 1/136 (2006.01)
G02F 1/13 (2006.01)
G03F 1/00 (2012.01)
G03F 7/00 (2006.01)

(52) U.S. Cl. .............. 349/46; 349/187; 430/5; 430/311

(58) Field of Classification Search ............. None
See application file for complete search history.

(56) References Cited

U.S. PATENT DOCUMENTS

| 5,731,109 | A * | 3/1998 | Hwang ...................... 430/5 |
| 7,776,635 | B2 * | 8/2010 | Ahn et al. ................. 438/34 |
| 2005/0095757 | A1 * | 5/2005 | Choi et al. ............. 438/151 |
| 2007/0007534 | A1 | 1/2007 | Kim |

FOREIGN PATENT DOCUMENTS

| CN | 1164673 | 11/1997 |
| CN | 1794077 | 6/2006 |

OTHER PUBLICATIONS

Office Action issued in corresponding Chinese Patent Application No. 200810173007.8; Apr. 27, 2010.

* cited by examiner

*Primary Examiner* — Michelle R Connelly
(74) *Attorney, Agent, or Firm* — Brinks Hofer Gilson & Lione

(57) ABSTRACT

The present invention relates a method for forming a pattern includes the steps of forming a thin film on a substrate, coating a photoresist film on the thin film, aligning a mask over the photoresist film, the mask formed on a base material, including a light shielding portion having a linear supporting portion and an uneven portion at a boundary of the supporting portion, and a transmission portion defined at regions excluding the light shielding portion, exposing the photoresist film with the mask thereon to a UV beam of a wavelength greater than 300nm to cause refraction in the vicinity of the uneven portion, and developing the photoresist film exposed thus to form a photoresist film pattern, and patterning the thin film by using the photoresist film pattern thus formed.

6 Claims, 23 Drawing Sheets defective
pattern

EXPOSING DEVICE, METHODS FOR FORMING PATTERN, CHANNEL, AND HOLE BY USING THE SAME, AND LIQUID CRYSTAL DISPLAY DEVICE THEREWITH AND METHOD FOR FABRICATING THE SAME

RELATED APPLICATIONS

This application claims the benefit of the Patent Korean Application No. P2007-108674, filed on Oct. 29, 2007, which is hereby incorporated by reference as if fully set forth herein.

BACKGROUND

1. Field of the Invention

The present invention relates to a liquid crystal display device, and more particularly, to an exposing device which can form a micron pattern even with an exposing device having a low resolving power by changing a mask pattern, methods for forming a pattern, a channel, and a hole respectively, and a liquid crystal display device therewith and a method for fabricating the same.

2. Discussion of the Related Art

A related art method for forming a pattern will be described with reference to the attached drawings.

FIG. 1 schematically illustrates a method for forming a pattern by using a related art exposing device.

Referring to FIG. 1, the method for forming a pattern by using a related art exposing device has the following steps.

First, a thin film 4 to be patterned is deposited on a substrate 3, and a photoresist film 5 is coated on the thin film 4.

Then, an exposing device 1 which can emit a light with a wave length longer than 300 nm and a mask 2 which can project an image of a predetermined pattern to the photoresist film 5 upon reception of the light from the exposing device 1 are arranged over the photoresist film 5.

The mask 2 has a light transmission portion 2a and a light shielding portion 2b defined therein, wherein the light transmission portion 2a defines a portion that exposes the photoresist film 5 to the light, and the light shielding portion 2b defines a portion that shields the light. For example, if the photoresist film 5 has a positive light sensitivity, the portion of the photoresist film 5 corresponding to the transmission portion 2a is a portion to be removed after exposure and development, and the portion 5a of the photoresist film 5 corresponding to the light shielding portion 2b is a portion to be remained after the exposure and development. If the photoresist film has a negative light sensitivity, the photoresist film will be oppositely patterned.

FIG. 2 illustrates a plan view of an exemplary related art mask.

Referring to FIG. 2, the related art mask has line shapes of the shielding portions 2b, and the other region defined as the transmission portion 2a. For example, the mask shown in FIG. 2 can form gate lines, data lines, or pixel electrodes or common electrodes in correspondence to the line shaped light shielding portions 2b in the case of a liquid crystal display device. In this case, a width A of the light shielding portion 2b or a gap A' between the light shielding portions 2b which is to be formed at the mask 2 can be fixed by a resolving power of the exposing device 1, wherein the stronger the resolving power of the exposing device 1, a pattern having the finer width A or gap A' of the light shielding portions 2b and the light transmission portions 2a can be formed. That is, even if the width A and the gap A' of the light shielding portions 2b and the light transmission portions 2a can be made thin in the mask 2, it is difficult to form the pattern as desired under the mask 2 at the time of exposure if the exposing device 1 has a low resolving power. In this instance, if the photoresist film 5 has positive sensitivity, the portion of the substrate corresponding to the light shielding portion 2b will be the portion that remains of the photoresist film 5 after the exposure and development, and the portion of the substrate corresponding to the light transmission portion 2b will be the portion removed from the photoresist film 5 after the exposure and development.

FIGS. 3A and 3B illustrate photographs of examples in which patterns are formed with a related art mask and a regular resolving power of the exposing device and a resolving power higher than the exposing device, respectively.

Referring to FIG. 3A, when a pattern is formed on the photoresist film with a mask shown in FIG. 2 and a regular resolving power of the exposing device (a pattern greater than 4 μm can be formed), widths of portions that remain in, and are removed from the photoresist film after the exposure and development are fixed in proportion to a ratio of the light shielding portion 2b to the transmission portion 2a of the mask 2, and formed uniformly without defect.

However, referring to FIG. 3B, when a micron pattern of a size below 4μ is formed with a resolving power higher than the exposing device, because the resolving power of a wave length of a light from the exposing device is greater than the widths of the light transmission portion 2a or the light shielding portion 2b of the mask 2, since regular exposure on the photoresist film by the light passed through the transmission portion 2a of the mask 2 fails, defects, such as line shorts, are taken place on the portions of the photoresist film corresponding to the light shielding portions 2b of the mask after the exposure and the development.

That is, the exposing device generally used in fabrication of the liquid crystal display device has about 300 nm of wavelength emitted from the exposing device, enabling to form up to approx. 4 μm pattern line width. As far as the exposing device 1 is not changed to another equipment that has a resolving power stronger than the exposing device 1, it is difficult to form a pattern having a line width thinner than the 4 μm pattern line width, and if tries, defects, such as pattern disconnection, can take place. Therefore, improvement on this is in need.

BRIEF SUMMARY

An exposing device includes a light source for emitting a UV beam of a wavelength greater than 300 nm, and a mask formed on a base material, including a light shielding portion having a linear supporting portion and an uneven portion at a boundary of the supporting portion, the light shielding portion having a greatest length below 4 μm, and a transmission portion defined at regions excluding the light shielding portion.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 4:
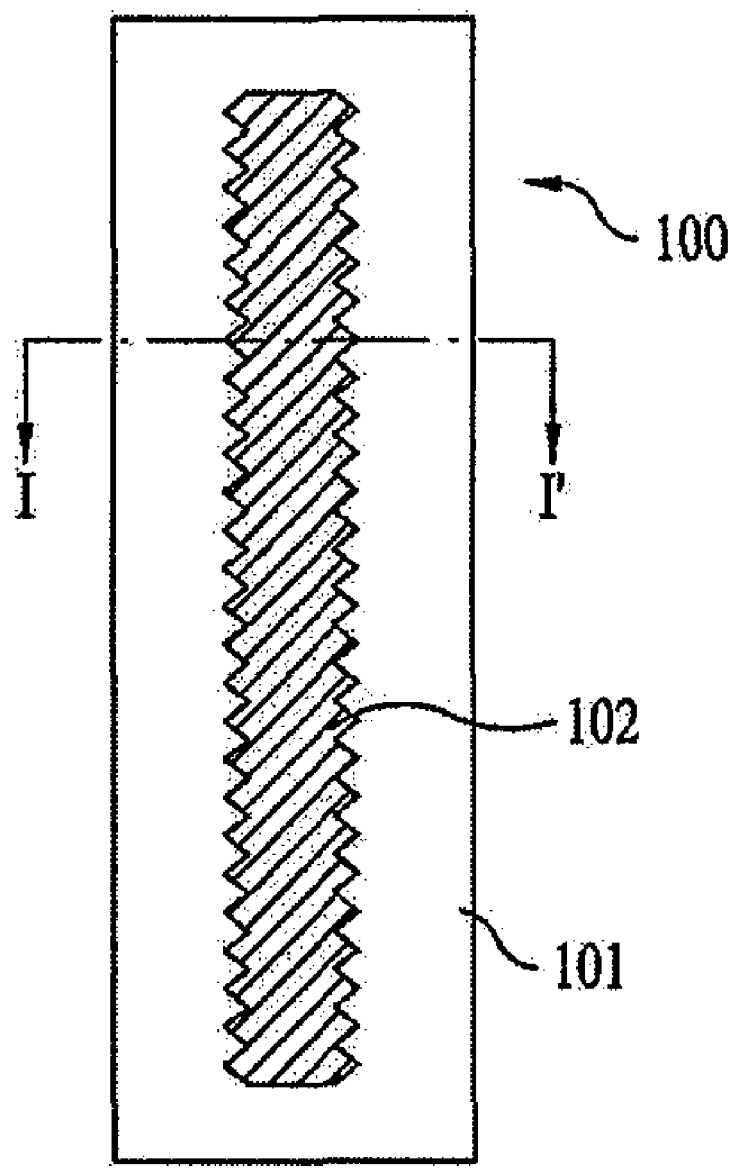
FIG. 4 illustrates a plan view of a mask in accordance with a first preferred embodiment of the present invention applicable to a method for forming a pattern of the present invention.
Figure 5:
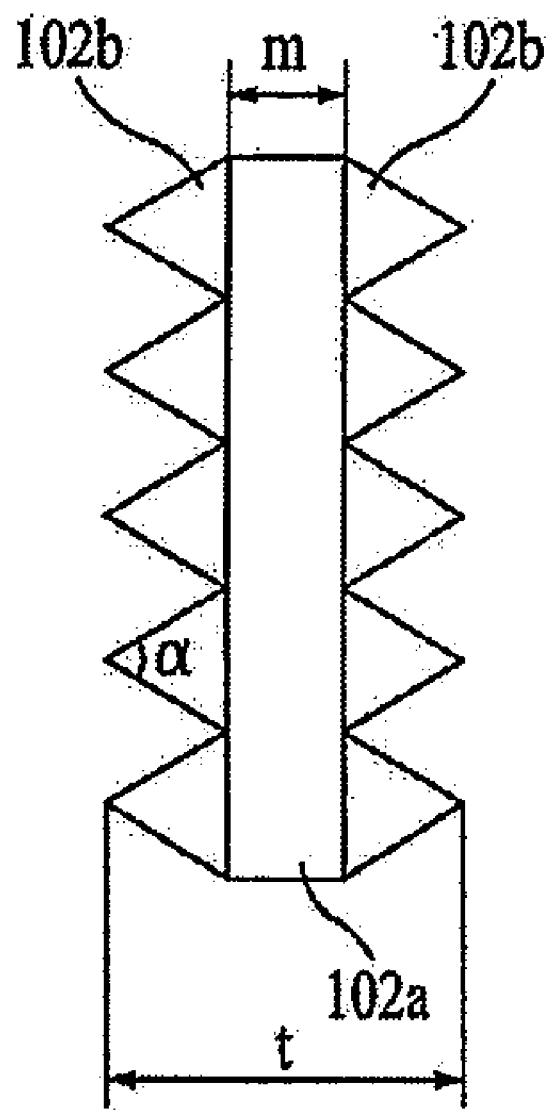
FIG. 5 illustrates a diagram of the light shielding portion of the mask in FIG. 4 in detail.
Figure 6A:
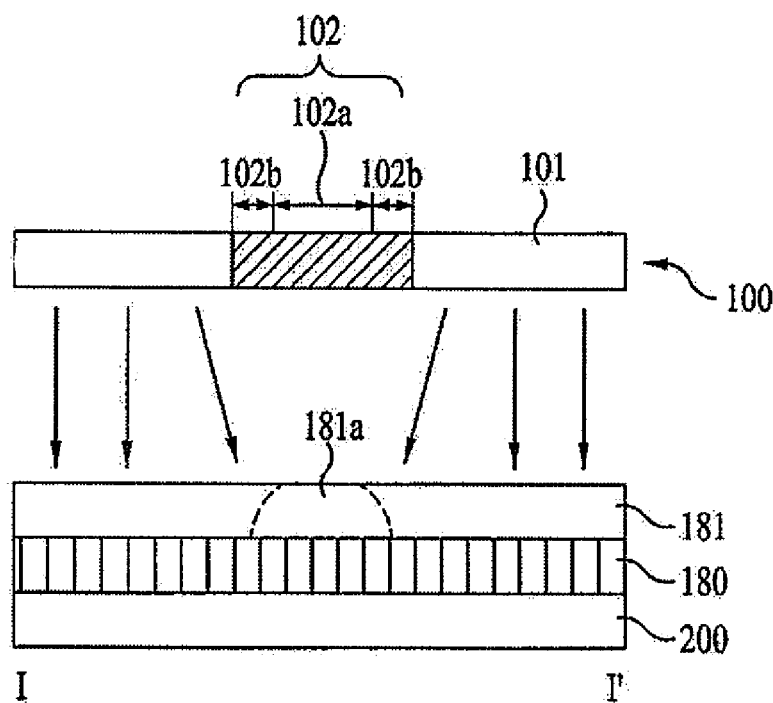
FIGS. 6A~6C illustrate sections across a line I~I' in FIG. 4 showing the steps of a method for forming a pattern in accordance with a preferred embodiment of the present invention, respectively.
Figure 6B:
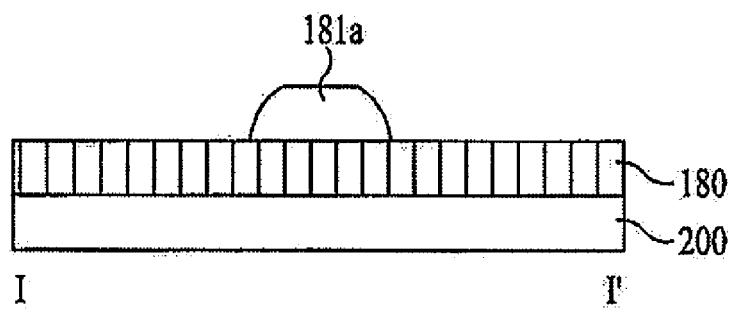
Figure 6C:
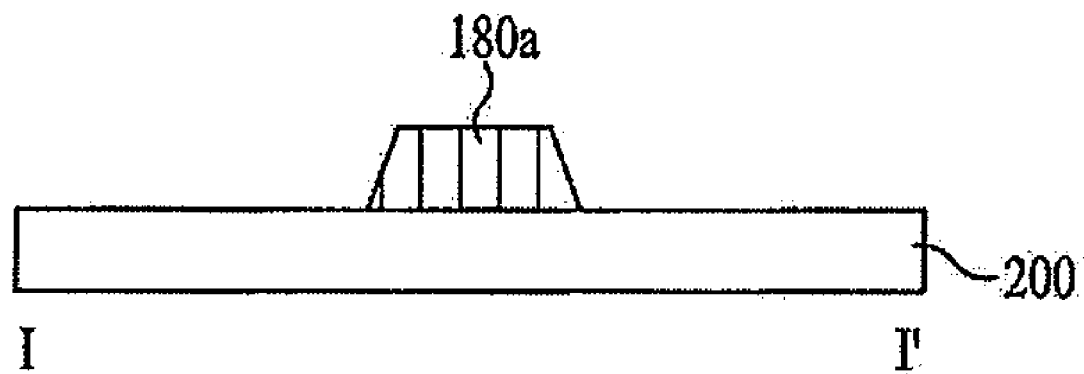
Figure 7:
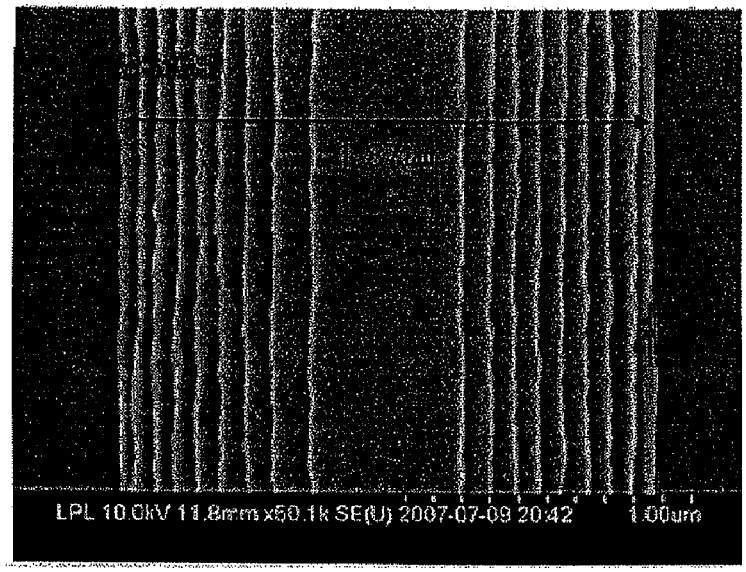
FIG. 7 illustrates an SEM after exposure and development of a photoresist film on a thin film by using a mask in FIG. 4.

FIG. 4 illustrates a plan view of a mask in accordance with a first preferred embodiment of the present invention applicable to a method for forming a pattern of the present invention, FIG. 5 illustrates a diagram of the light shielding portion of the mask in FIG. 4 in detail, FIGS. 6A~6C illustrate sections across a line I~I' in FIG. 4 showing the steps of a method for forming a pattern in accordance with a preferred embodiment of the present invention respectively, and FIG. 7 illustrates an SEM after exposure and development of a photoresist film on a thin film by using a mask in FIG. 4.

Referring to FIGS. 4 and 5, the mask 100 includes a linear supporting portion 102a of a fixed width, a light shielding portion 102 having an uneven portion 102b at one or both sides of the linear supporting portion 102a, with projections, and a transmission portion 101 defined at portions other than the light shielding portion 102.

The mask 100 is formed of a transparent base material, such as quartz, which transmits a light, and a material which can shield the light, such as chromium, for serving as the light shielding portion 102.

The light shielding portion 102 of the mask 100 defines a portion of a thin film to be patterned corresponded either in contact or not in contact with the mask 100.

In the meantime, referring to FIG. 5, the linear supporting portion 102a of the light shielding portion 102 has a line width m, and the uneven portion 102b on both sides of the linear supporting portion 102 has triangles formed repeatedly each with a bottom side in contact with the supporting portion 102 and an opposite angle of the bottom side to be α. In this instance, a total width of the light shielding portion 102 including the supporting portion 102a and the uneven portion 102b at a portion thereof with the greatest width is t, wherein the t is about 3.5~4 μm, the m is about 2 μm, and the angle α is about 30~150°. It is verified from an experiment that, if the pattern of the uneven portion 102b is the triangles, the mask can form a pattern having a finer line width when the triangle is an isosceles triangle and the angle α is in a range of 30-60°.

A method for forming a pattern by using the mask in FIG. 4 will be described with reference to FIGS. 6A-6c.

Referring to FIG. 6A, a thin film 180 to be patterned is deposited on a substrate 200.

Then, a photoresist film 181 is coated on the thin film 180.

Then, a mask 100 as shown FIGS. 4 and 5 which has a linear supporting portion 102a, a light shielding portion 102 having uneven portion 102b with regular unevenness on both sides thereof, and a rest of regions defined as a transmission portion 101 is aligned over the photoresist film 181. In this instance, the mask 100 may or may not be in contact with the photoresist film 181 (as an example, FIG. 6A illustrates the mask 100 not in contact with the photoresist film 181).

Then, upon exposing the photoresist film 181 by using the mask 100, entire light incident onto the transmission portion 101 is refracted partially at the uneven portion 102b of the light shielding portion 102 to define an exposed portion 181a of the photoresist film 181, which has a width smaller than the total width of the light shielding portion 102. In this instance, the refraction takes place, not only at the uneven portion 102b, but also at a portion of an inner side of the supporting portion 102a. In this instance, the light is shielded fully at a center portion of the supporting portion 102a, while the light is exposed partially at a boundary of the supporting portion 102a, to cause a difference of light quantities between regions of the supporting portion 102a.

Referring to FIG. 6B, after providing the mask 100 having the light shielding portion 102 and the light transmission portion 101, if the photoresist film is exposed and developed by using a light which emits a UV beam with a wavelength greater than 300 nm, a photoresist film pattern 181a can be formed, which has a line with below 2 μm, i.e., in a range of about 1.87 μm, at a portion corresponding to the light shielding portion 102. Thus, if the light has a wavelength greater than 300 nm, the light refracts at the uneven portion 102b. That is, the light transmits partially at the uneven portion 102b having repetitive identical patterns owing to refraction, to form a photoresist pattern 181a which has a line width in a range of the supporting portion 102a or slightly greater than the supporting portion 102a. In this case, the photoresist pattern 181a formed thus has a trapezoidal profile by the refraction of the light at boundaries of the uneven portion 102b and the supporting portion 102a, with a flat top, and sides each sloped at an acute angle with respect to a surface of the photoresist film substantially such that a CD (Critical Dimension) value increases gradually step by step as the CD value moves down from the top portion to a lower portion of the profile the more.

Referring to FIG. 6C, if the thin film 180 is etched by using the photoresist film 181a, to remove regions excluding the photoresist film pattern 181a, a thin film pattern 180a is formed. In this case, the thin film pattern 180 has a profile similar to a trapezoid, because the steps at the sides of the photoresist film pattern 181a cause to form undercuts at the sides of the photoresist film pattern 181a. In this instance, the line width of the thin film pattern 180a patterned thus is smaller than the CD value of the photoresist film pattern 181a, so as to be below the line width of the photoresist film pattern 181a shown in FIG. 7, making a micron pattern below 2 μm, possibly in a range of 1 μm, available.

A light shielding portion other than the mask and the light shielding portion described with reference to FIGS. 4 and 5 used in the foregoing method for forming a pattern will be described.

FIGS. 8A-8F illustrate plan views of various light shielding portions of a mask in accordance with embodiments of the present invention, respectively.

Figure 8A:
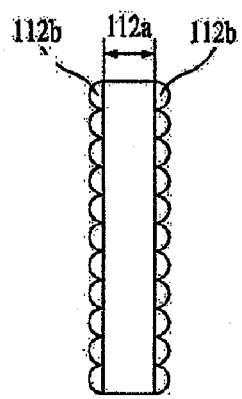
FIGS. 8A~8F illustrate plan views of various light shielding portions of a mask in accordance with embodiments of the present invention, respectively.

Referring to FIG. 8A, the light shielding portion of a mask in accordance with a second preferred embodiment of the present invention has an uneven portion 112b with repetitive semi-circles at sides of a supporting portion 112a. In comparison to the light shielding portion in the first embodiment, the light shielding portion in the second embodiment has the repetitive semi-circles instead of the repetitive triangles.

Figure 8B:
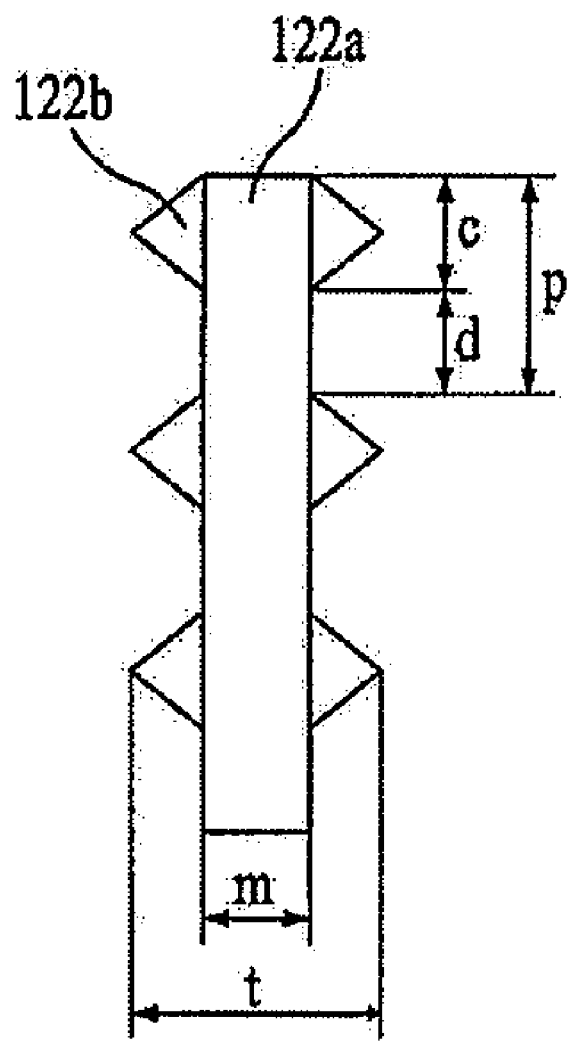

Referring to FIG. 8B, the light shielding portion of a mask in accordance with a third preferred embodiment of the present invention has an uneven portion 122b including cyclic patterns each with a length p having a triangular projection portion with a bottom side of a length c in contact with a side of a supporting portion 122a and a flat portion exposing the supporting portion 122a each with a length d.

Figure 8C:
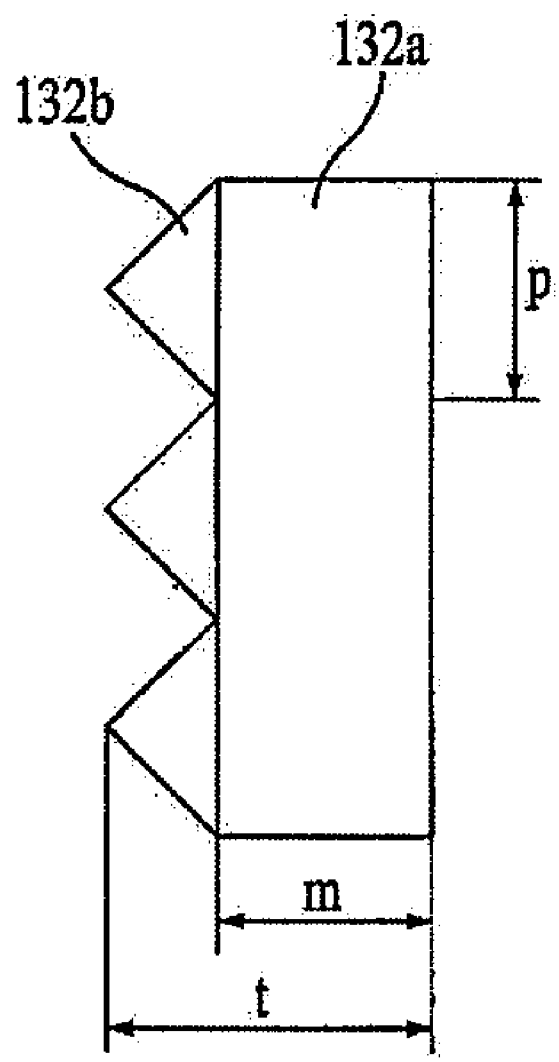

Referring to FIG. 8C, the light shielding portion of a mask in accordance with a fourth preferred embodiment of the present invention has an uneven portion 132b formed at one side of a supporting portion 132a. In this instance, if it is assumed that a line width of the supporting portion 132a is m, and a total width of the light shielding portion from the other side of the supporting portion 132a to an apex of the triangle of the uneven portion 132b is t, in order to obtain an adequate refraction effect at the uneven portion 132b at an edge portion, because it is preferable that the m is not greater than 2 μm if the greatest line with t of the light shielding portion having the supporting portion 132a and the uneven portion 132b is fixed, a height of the triangle which is one cycle pattern of the uneven portion 132b can be greater than a height of the triangle in a case of the third embodiment.

Figure 8D:
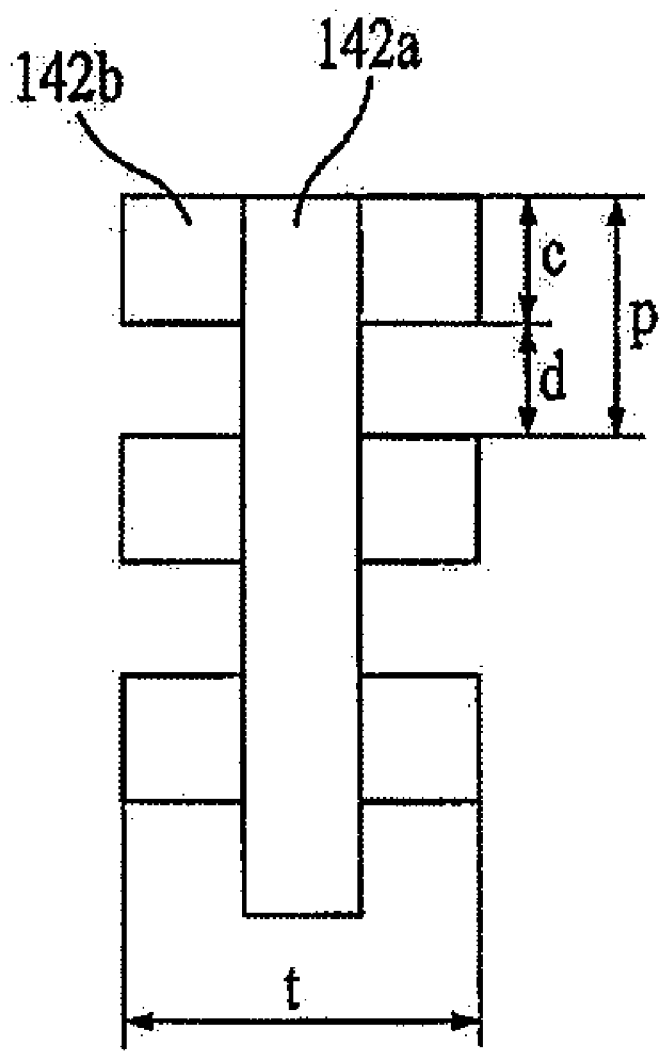

Referring to FIG. 8D, the light shielding portion of a mask in accordance with a fifth preferred embodiment of the present invention has an uneven portion 142b including cyclic patterns each with a length p having a rectangular projection portion with a bottom side of a length c in contact with a side of a supporting portion 142a and a flat portion exposing the supporting portion 142a each with a length d. The light shielding portion has a rectangular projection portion instead of the triangular projection portion in the third embodiment, and other portions identical to the third embodiment. Moreover, besides the triangle or the rectangle, the projection portion may have polygonal, or semi-circular or elliptical as far as the line width is below 2 μm.

Figure 8E:
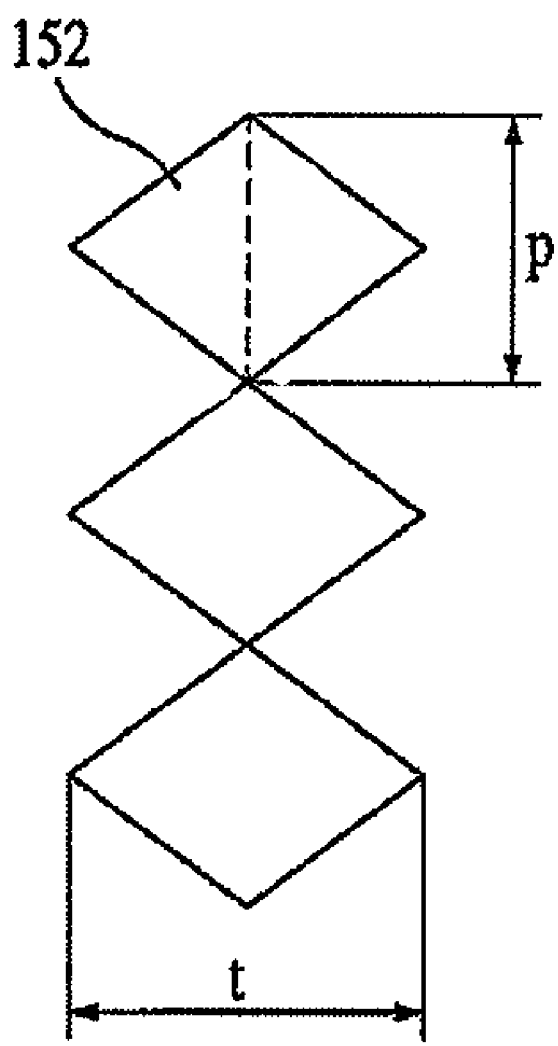

Referring to FIG. 8E, the light shielding portion 152 of a mask in accordance with a sixth preferred embodiment of the present invention has no separate supporting portion, but only uneven portion at both sides of the supporting portion in FIG. 5 excluding the supporting portion.

In this instance, the uneven portion has pairs of triangles arranged along an axis of the uneven portion each pair of triangles arranged on left and right sides of the axis, wherein the pair of triangles have bottom sides each with a length p in contact with each other at the axis. Thus, the pair of triangles forms one cyclic pattern to form a diamond shape with a diagonal length p in the axis direction.

Figure 8F:
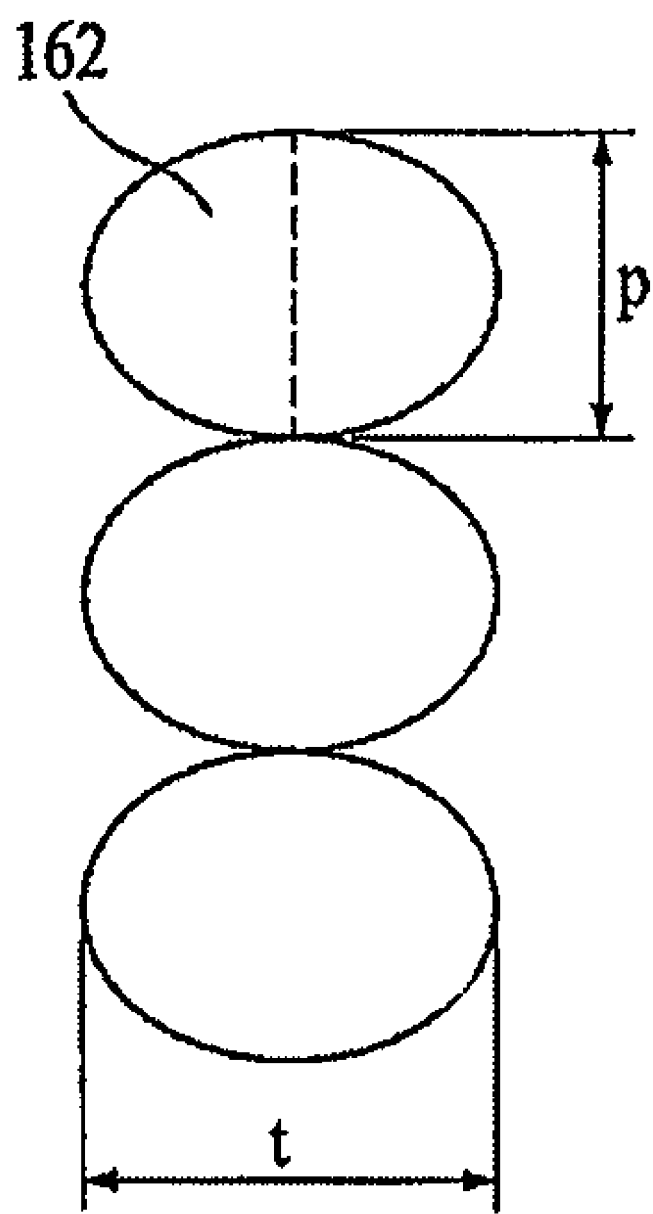

Referring to FIG. 8F, alike the sixth embodiment, the light shielding portion 162 of a mask in accordance with a seventh preferred embodiment of the present invention has no separate supporting portion, but only uneven portion. The one cyclic pattern of the uneven portion has pairs of semi-circles or semi-ellipses arranged along an axis of the uneven portion each pair of the semi-circles or the semi-ellipses arranged on left and right sides of the axis, wherein the pair of the semi-circles or the semi-ellipses have bottom sides each with a diameter p in contact with each other at the axis. Thus, the pair of the semi-circles or the semi-ellipses forms one cyclic pattern to form a circle or ellipses with a diameter p in the axis direction.

The one cyclic pattern of the light shielding pattern only having the uneven portion in accordance with the sixth or seventh embodiment of the present invention may have polygonal shapes other than the triangle or the circle.

In the first to seventh embodiments, the greatest width t of the light shielding portion, which is a sum of the widths of uneven portion and the supporting portion, is set to be about 3.5-4 μm, and the width m of the supporting portion is set to be below 2 μm. That is, in order to have the refraction effect only at the uneven portion, a length of the uneven portion is set to be 0.5-2 μm, and the width of the supporting portion is set to be within 2 μm. By this, the micron pattern can be formed, with a line width below 4 μm, and at the smallest 1.5 μm.

The method for forming the micron pattern described above may be used as means for increasing aperture, if, for an example, the method is applied to the liquid crystal display device, and especially, for forming a line width smaller than 2 μm in formation of a pixel electrode at a pixel region or a common electrode, if the method is applied to an IPS type liquid crystal display device. Besides, the method may be used for reducing a line width of a gate line, data line, or a common line, or source/drain electrodes.

Thus, the method for forming a micron pattern enables to form a line width below 4 μm, preferably 2 μm.

Methods for making fine adjustment of widths of portions to be removed between patterns, such as a channel and a contact hole, will be described.

Figure 9:
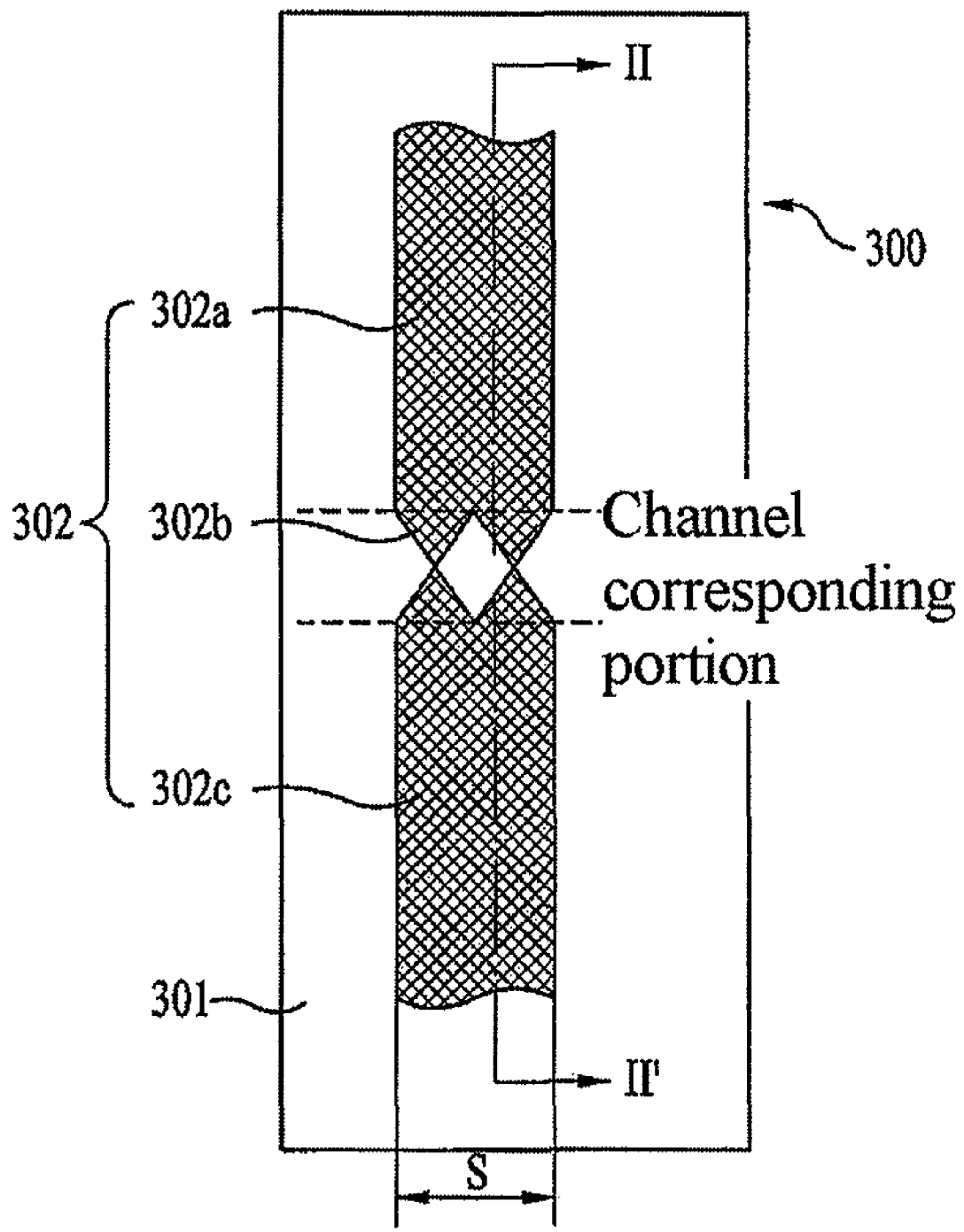
FIG. 9 illustrates a plan view of a mask applied to formation of a micron channel of the present invention.
Figure 10A:
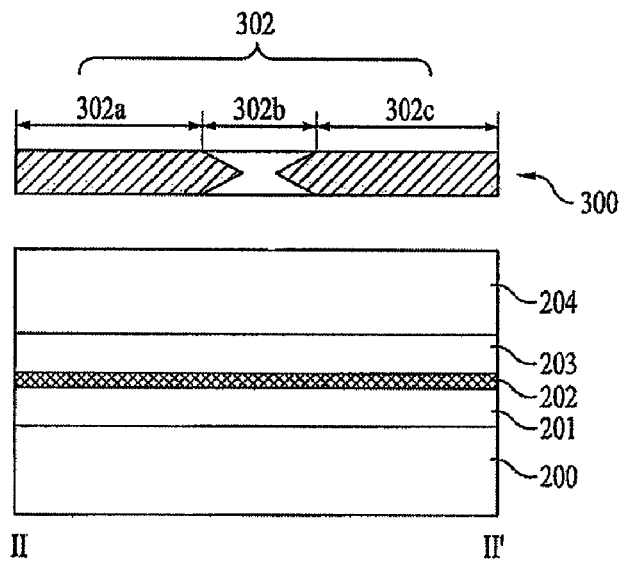
FIGS. 10A~10D illustrate sections across a line II~II' in FIG. 9 showing the steps of a method for forming a micron channel in accordance with a preferred embodiment of the present invention, respectively.
Figure 10B:
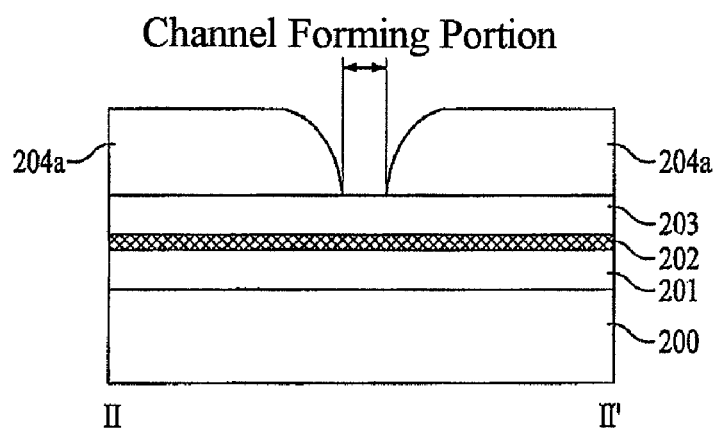
Figure 10C:
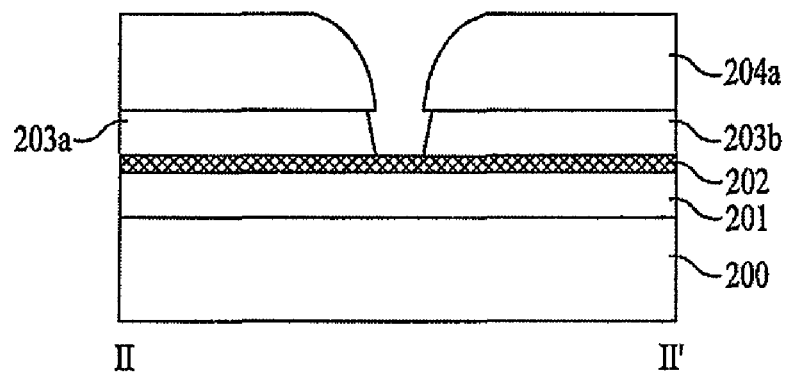
Figure 10D:
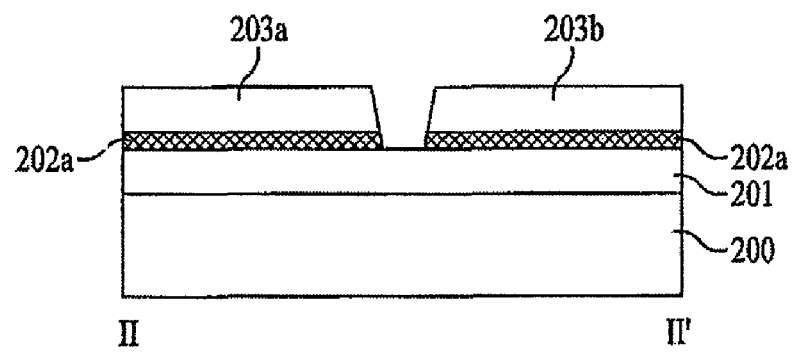
Figure 11:
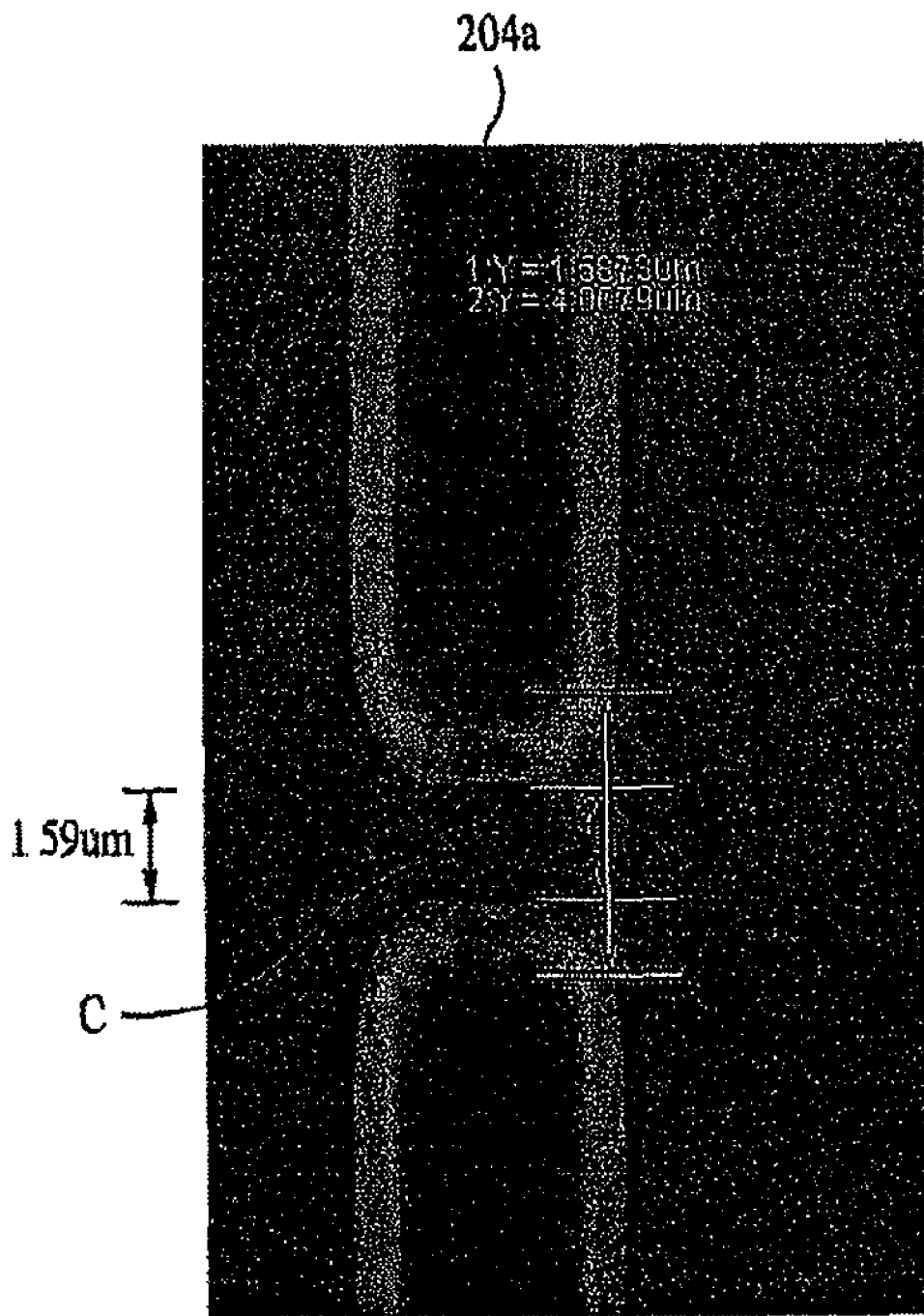
FIG. 11 illustrates an SEM after exposure and development of a photoresist film on a thin film by using a mask in FIG. 9.

FIG. 9 illustrates a plan view of a mask applied to formation of a micron channel of the present invention, FIGS. 10A~10D illustrate sections across a line II~II' in FIG. 9 showing the steps of a method for forming a micron channel in accordance with a preferred embodiment of the present invention respectively, and FIG. 11 illustrates an SEM after exposure and development of a photoresist film on a thin film by using a mask in FIG. 9.

Referring to FIG. 9, a mask 300 for forming a micron channel of the present invention has a supporting portion 302a and 302c corresponding to portions for forming lines of a source electrode and drain electrode, a light shielding portion 302 having a channel corresponding portion with an uneven portion 302b defined thereon, and a transmission portion 301 which is a region excluding the light shielding portion 302. In this case, the supporting portion 302a and 302c has a line width S corresponding to a line width of the source/drain electrodes to be patterned.

As shown, the uneven portion 302b may be opposite triangles, or, as described with reference to FIGS. 8A~8F, semicircles or polygons.

The uneven portion 302b between the supporting portion 302a and 302c connects a first supporting portion 302a corresponding to a portion for forming the source electrode, and a second supporting portion 302c corresponding to a portion for forming the drain electrode, and includes pairs of opposite triangles on boundaries of the first, and second supporting portions 302a and 302c. The opposite triangles formed on the first and second supporting portions 302a and 302c may or may not be in contact with each other.

In this instance, the contact or a size of a gap between the uneven portions of the first and second supporting portions 302a and 302c may depend on a length L of the channel. It is preferable that the uneven portions are formed to be in contact or with each other or adjacent to each other because it is a trend that, if the size of the gap is great, the channel length L becomes great. Since the refractive effect becomes the stronger as the projection is the finer, and a number of repetitive projections of the uneven portion is the greater, a number of repetitive projections of the uneven portion formed on the boundaries of the first and second supporting portions 302a and 302c is determined taking thickness of the photoresist film pattern and a channel length intended to form after exposure and development into account.

In the mask 300, the refractive effect induced by the uneven portion 302b at the time of exposure is not limited to the uneven portion 302b, but can take place at the uneven portion 302b and the first, and second supporting portions 302a and 302c. Therefore, the channel length defined as a length between the source electrode and the drain electrode after exposure and development with the mask 300 and etching of a metal layer may have a width identical to, slightly smaller or larger than the width of the uneven portion 302b. In this case, the smaller the width of the uneven portion 302b, the smaller the micron channel.

It is verified from experiments that, if the uneven portion 302b has the triangular pattern, formation of the micron length channel is possible if the triangles having bottoms sides on the boundaries of the first and second supporting portions 302a and 302c are isosceles triangles and the apex angle is in a range of 30-60°.

In the meantime, the channel is defined at a semiconductor layer between the source electrode and the drain electrode form spaced from each other. When the semiconductor layer having an amorphous silicon layer and an impurity layer ($n^+$ doped layer) and the source/drain electrodes are stacked in succession, a portion of the impurity layer of the semiconductor layer in a space between the source electrode and the drain electrode is removed, to define a region having the impurity layer removed therefrom as the channel. In this case, in patterning the semiconductor layer and the source/drain electrodes existing at layers different from each other, if the patterning uses the same mask, the patterning process is called as a 4 mask process, and if the patterning uses the different masks, the patterning process is called as a 5 mask process.

Both the 4 mask process and the 5 mask process define the channel according to a space shape between the source/drain electrodes after patterning the source/drain electrodes. A process for defining the channel will be described.

Referring to FIG. 10A, a semiconductor layer having a stack of an amorphous silicon layer 201 and an impurity layer ($n^+$ layer) 202 is formed on a substrate 200.

Then, a metal layer 203 is deposited on the semiconductor layer 201 and 202 for forming a data line and source/drain electrodes.

Then, a photoresist film 204 is coated on an entire surface of the metal layer 203.

Then, the mask 300 in FIG. 9 is aligned over the photoresist film 203, wherein the mask 300 has a supporting portion 302a and 302c for forming the source/drain electrodes and the uneven portion 302b of the uneven pattern for forming the region between the source/drain electrodes.

Referring to FIG. 10B, an UV beam with a wave length greater than 200 nm is directed to the mask 300 in FIG. 9 to expose and develop the photoresist film 204 to form a photoresist film pattern 204a which has entire thickness of the supporting portion 302a and 302c left intact and a profile of the uneven portion 302b moderately sloped at an acute angle with respect to the substrate starting from edges of the supporting portions 302a and 302c owing to the refractive effect of the light at the uneven portion 302b. In this instance, the photoresist film 204 corresponding to the transmission portion 301 is removed excluding the light shielding portion 302. In above photoresist film pattern 204a formed thus, a region of the metal layer exposed thus is defined as a channel forming portion.

Though FIG. 10B shows the photoresist film pattern 204a having a portion removed therefrom in correspondence to a channel portion, if occasion demands, the photoresist film pattern can be formed by adjusting the shape and intervals of the projections of the uneven portion 302b and a size of the gap of the uneven portions 302 in contact with the opposite supporting portions 302a and 302c to leave entire thickness of the photoresist film 204 for the source/drain electrode forming portion and a relatively small thickness of the photoresist film for the channel corresponding portion. A latter description can be applicable to the 4 mask process in which the semiconductor layer and the source/drain electrodes are patterned with one mask. In this case, by the exposure and development described above, at first, a portion of the photoresist film for the channel corresponding portion has the relatively small thickness to form a first photoresist film pattern, the metal layer 203 and the semiconductor layer 202 and 201 are etched from the first photoresist film pattern to define a data line (not shown), and the first photoresist film pattern is subjected to ashing enough to remove the first photoresist film pattern left at the channel forming portion, to form a second photoresist film pattern identical to the photoresist film pattern 204a shown in FIG. 10B. Then, the second photoresist film pattern is used for carrying out a channel forming process described with reference to FIGS. 10C and 10D as follows.

Referring to FIG. 10C, the metal layer 203 is etched from the photoresist film pattern 204a to form the source/drain electrodes 203a/203b. If it is the 5 mask process, the data line (not shown) is formed in correspondence to the light shielding portion 302 excluding the source/drain electrode forming portion of the mask 300. Thus, in the 5 mask process, the semiconductor layers 201 and 202 in FIG. 10A is in a patterned state in an island shape in advance to cover a portion of a gate line or a gate electrode (not shown) before formation of the metal layer 203 and the photoresist film 204 for forming the source/drain electrodes. In this case, the photoresist film pattern 204a in FIG. 10B is defined for forming the metal layer and the channel between the source/drain electrodes to be defined of the metal layer.

Then, referring to FIG. 10D, the impurity layer 202 is etched in succession from regions excluding the photoresist film pattern 204a, to form an impurity layer pattern 202a, and then, the photoresist film pattern 204a is removed. In this process, a region of the semiconductor layer between the source/drain electrodes 203a/203b having the impurity layer pattern 202a removed therefrom is called as the channel.

Referring to FIG. 11, if the photoresist film pattern 203a is formed by the exposure and development described with reference to FIGS. 10A and 10B with the mask shown in FIG. 9, it is possible to pattern the channel corresponding portion corresponding to a gap between the source/drain electrodes to be about 1.59 µm width.

FIG. 11 illustrates a test result of the mask 300 having the supporting portion 302a and 302c with a line width of about 4 µm, the uneven portion 302b connecting the supporting portions 302a and 302c with a length about 2 µm, and the uneven portion 302b with the pairs of the opposite triangles.

The SEM shows a state the photoresist film pattern is formed after the exposure and development. It can be known from the test that if the thin film is etched by using the photoresist film pattern, formation of the channel with a length below 4 µm can be formed, and by varying the pattern on the uneven portion 302b, formation of the channel with a length in a range of 1-2 µm can be formed. That is, a gap 1.59 µm in the photoresist film pattern shows possibility of a size of the gap between the source electrode and the drain electrode. By adjusting the shape of, and the space between, the projections of the uneven portion 302b, the gap between the source/drain electrodes can be formed in a range of about 1 µm for defining the channel therein.

Figure 12:
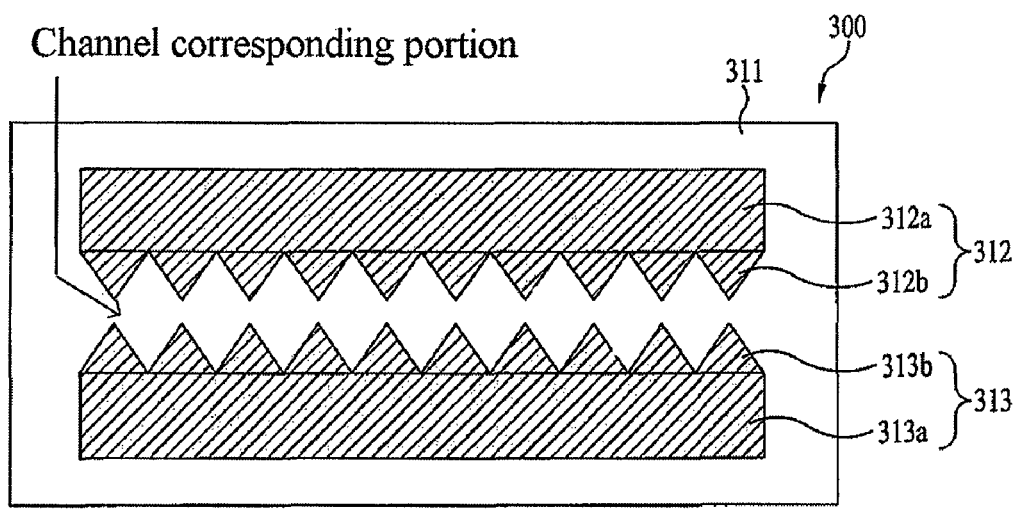
FIG. 12 illustrates a plan view of a mask applied to formation of a micron channel in accordance with another preferred embodiment of the present invention.

FIG. 12 illustrates a plan view of a mask applied to formation of a micron channel in accordance with another preferred embodiment of the present invention.

Referring to FIG. 12, the mask 300 used in the micron channel in accordance with another preferred embodiment of the present invention has a channel width formed greater than the foregoing embodiment. For an example, the mask 300 in FIG. 12 illustrates a mask portion in a length direction mask of a channel for forming in an L or U shaped channel.

In this case, the mask 300 has a light shielding portion 312 and 313 defined on opposite sides of a channel corresponding portion. The light shielding portion 312 and 313 includes a first supporting portion 312a corresponding to a source electrode forming portion, a first uneven portion 312b projected into a channel forming portion from a boundary of the first supporting portion 312a, a second supporting portion 313a corresponding to a drain electrode forming portion, and a second uneven portion 313b projected into a channel forming portion from a boundary of the second supporting portion 313a. Rest of portions excluding the light shielding portion 312 and 313 is defined as a transmission portion 311.

The exposing effect of the mask 300 is the same with the mask in FIG. 9 in that a difference of light quantities is induced at the first and second uneven portions 312b, and 313b by means of the refractive effect except that the light shielding portion 312 and 313 has a length of a channel corresponding portion increased to increase a channel width.

As described, the mask 300 for forming the micron channel also has the uneven portion at the channel corresponding portion between the source/drain electrode forming portion. As shown in FIG. 12, the uneven portion 312b and 313b may be formed spaced from the supporting portions 312a and 313a, or as shown in FIG. 9, in contact with each other. Whether the uneven portion 312b and 313b is formed spaced from the supporting portions 312a and 313a or not is determined with reference to a length of the micron channel intended to form.

Figure 13:
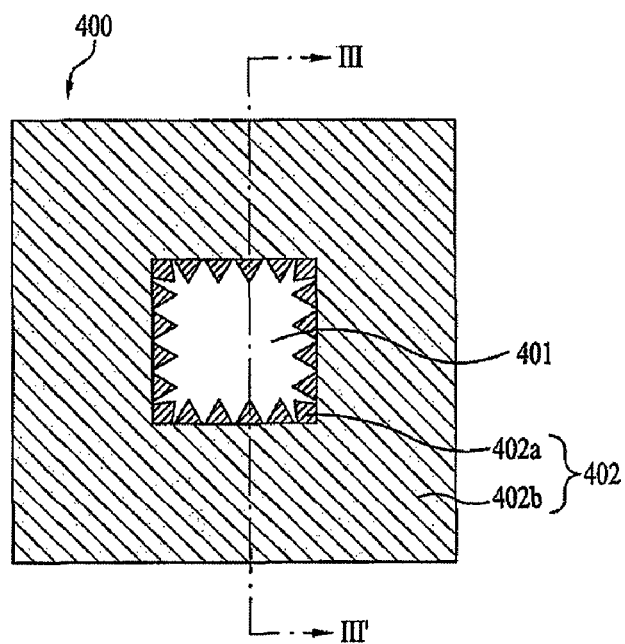
FIG. 13 illustrates a plan view of a mask used for forming a micron hole in accordance with a preferred embodiment of the present invention.

FIG. 13 illustrates a plan view of a mask used for forming a micron hole in accordance with a preferred embodiment of the present invention.

Referring to FIG. 13, the mask 400 used for forming a micron hole has a light shielding portion 402 having an uneven portion 402a at a boundary of a hole forming portion and a supporting portion 402b on an outer side of the hole forming portion defined thereon, and a transmission portion 401 in the uneven portion 402a defined thereon. The uneven portion 402a enables to form a micron hole in a layer, such as a protective film, smaller than a hole which can be defined by an inside region of the supporting portion 402b by patterning with the mask 400.

For an example, the micron hole may be used as a hole in the protective film for forming a contact hole to the drain electrode and the pixel electrode, or as a hole in a gate insulating film or the protective film for forming a gate terminal for inputting a signal to the gate line or for forming a data terminal for inputting a signal to the data line.

A method for forming a micron hole in accordance with a preferred embodiment of the present invention will be described with reference to the drawings attached hereto.

Figure 14A:
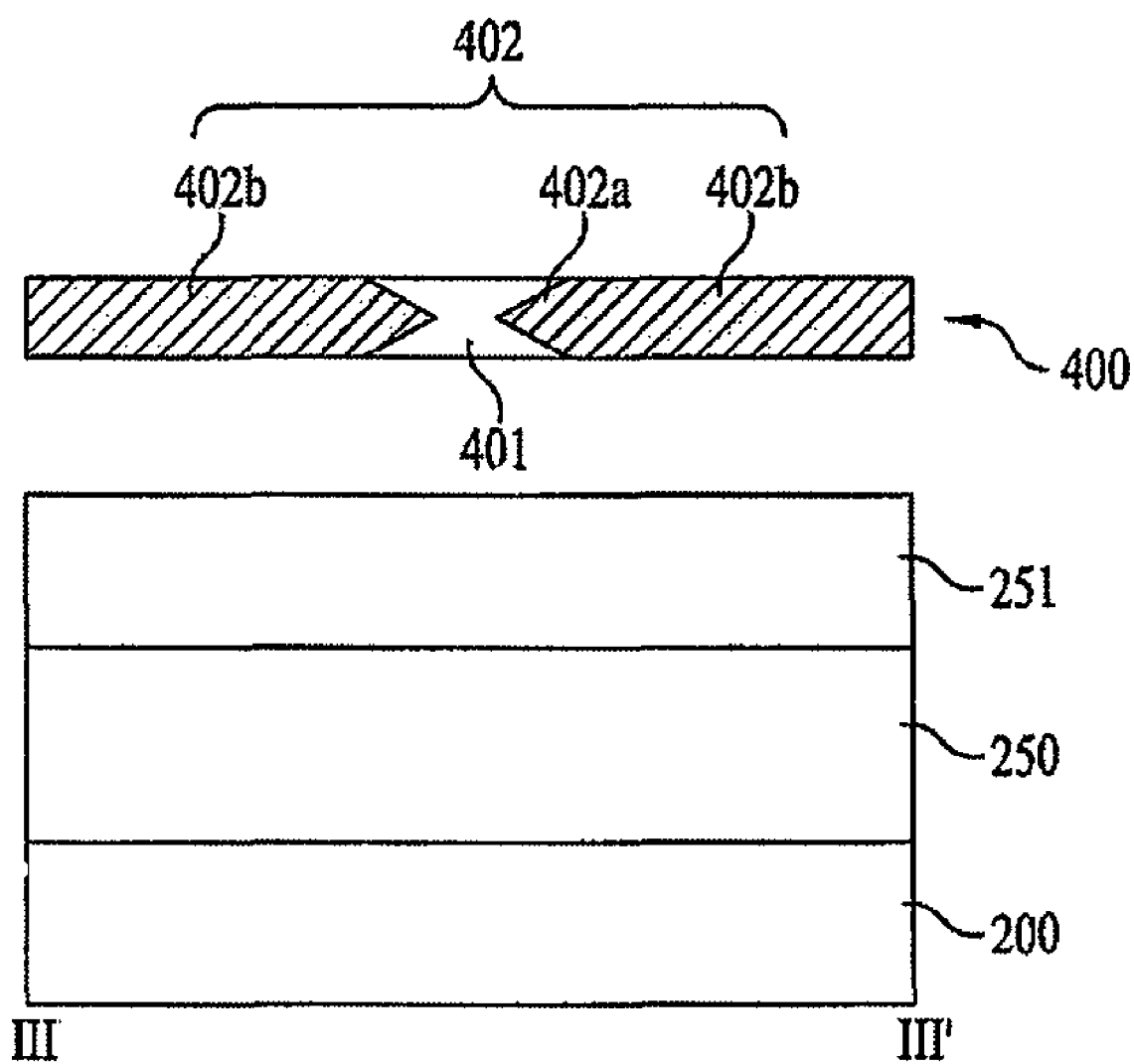
FIGS. 14A~14C illustrate sections across a line III~III' in FIG. 13 showing the steps of a method for forming a micron hole in accordance with a preferred embodiment of the present invention, respectively.
Figure 14B:
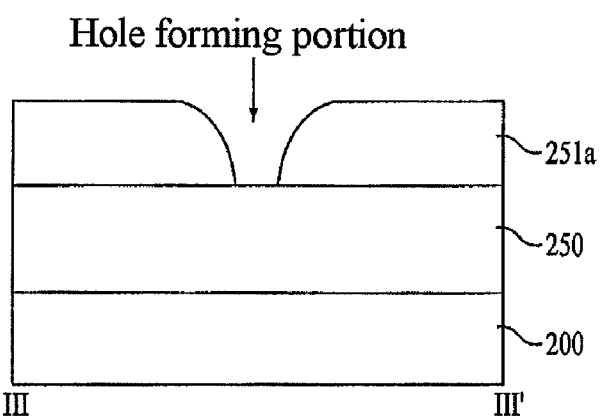
Figure 14C:
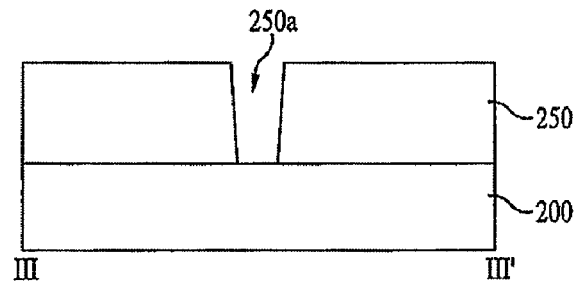

FIGS. 14A-14C illustrate sections across a line III-III' in FIG. 13 showing the steps of a method for forming a micron hole in accordance with a preferred embodiment of the present invention, respectively.

Referring to FIG. 14A, a protective film 250 is formed on a substrate 200.

Then, a photoresist film 251 is coated on the protective film 250.

Figure 1:
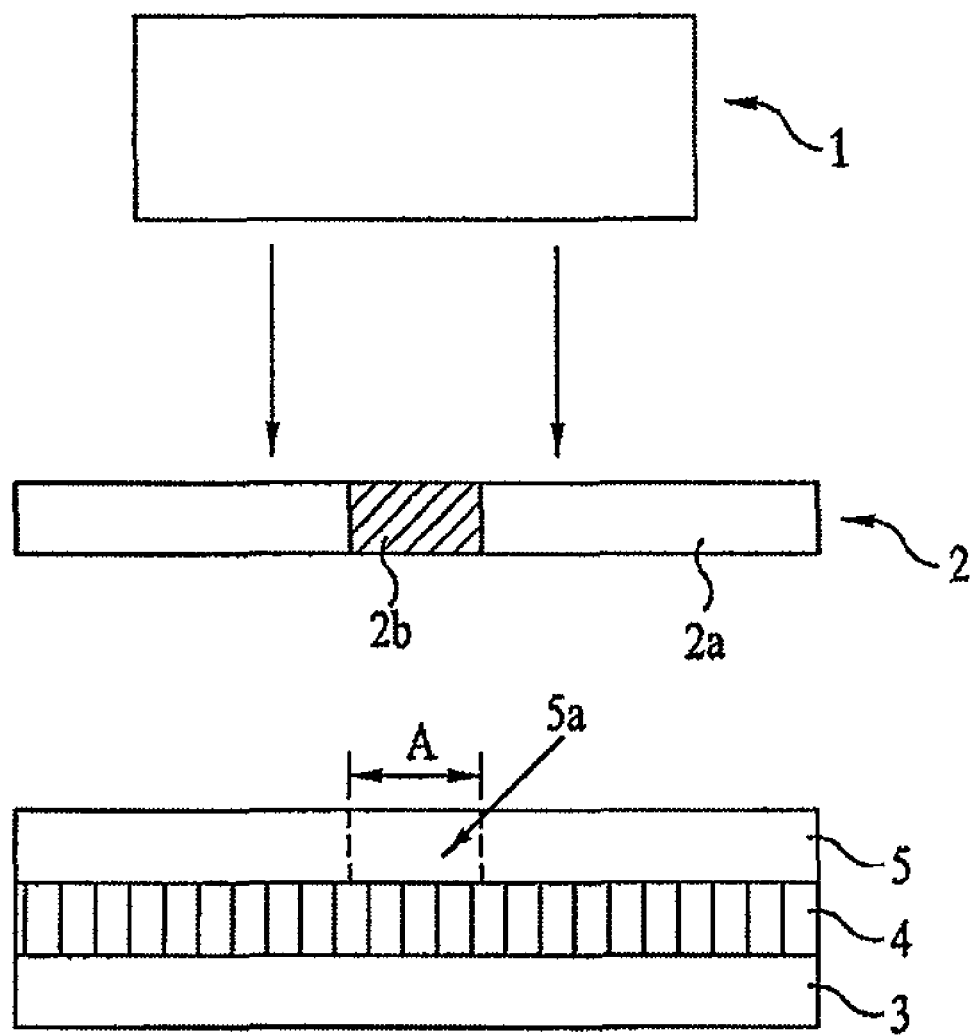
FIG. 1 schematically illustrates a method for forming a pattern by using a related art exposing device.
Figure 2:
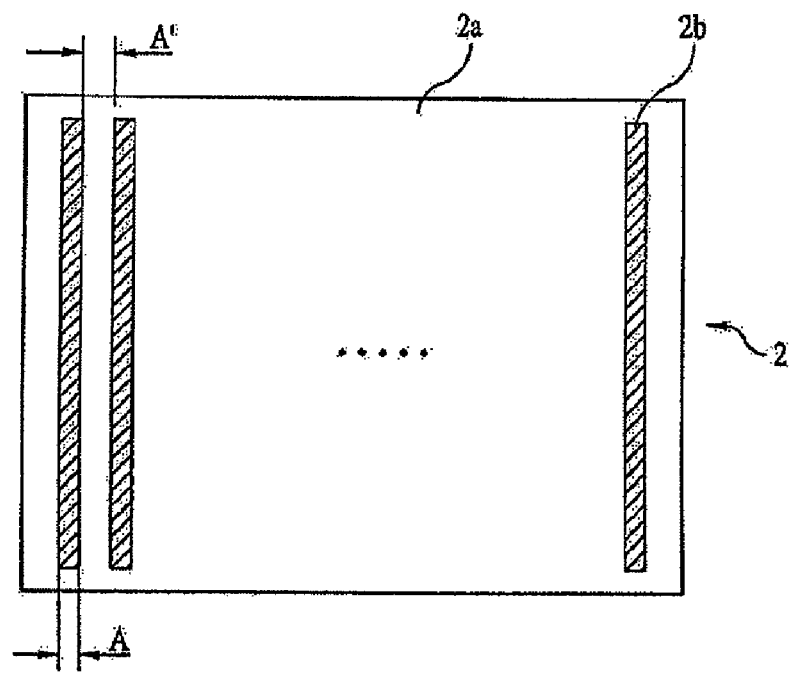
FIG. 2 illustrates a plan view of an exemplary related art mask.
Figure 3A:
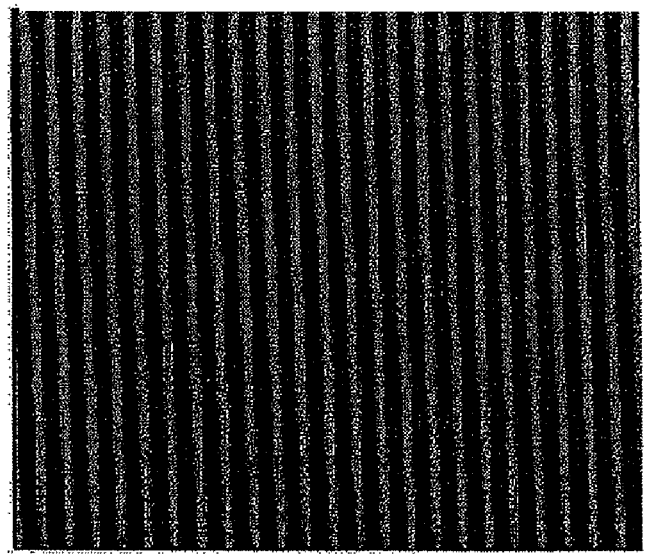
FIGS. 3A and 3B illustrate photographs of examples in which patterns are formed with a related art mask and a regular resolving power of the exposing device and a resolving power stronger than the exposing device, respectively.
Figure 3B:
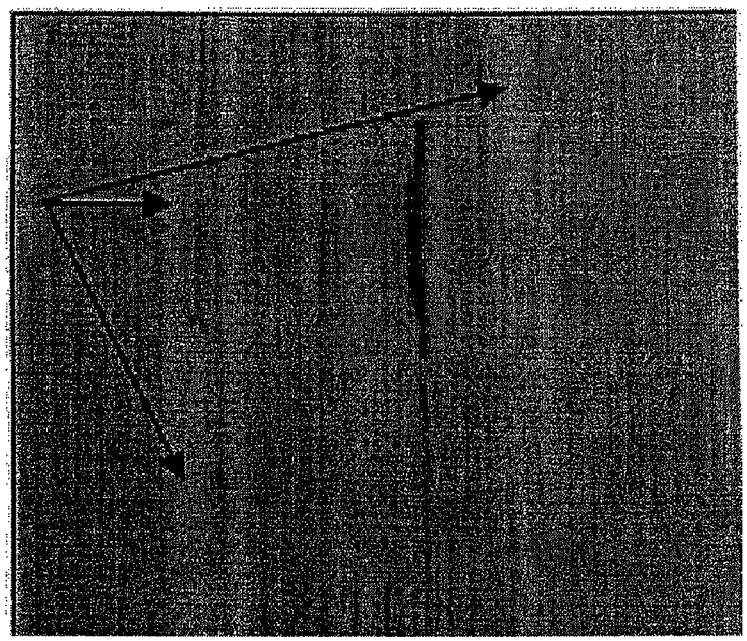

Referring to FIG. 14B, a photoresist film pattern 251a is patterned with the mask 400 in FIG. 3, having a hole forming portion defined thereon with a diameter smaller than a size of the supporting portion 402b owing to the refractive effect taking place at the uneven portion 402a and a boundary thereof. In this instance, the exposure is made with an exposing light (a UV beam) with a wavelength greater than 300 nm which has a resolving power lower than a resolving power that can pattern the hole forming portion.

Referring to FIG. 14C, the protective film 250 is etched by using the photoresist film pattern 251a, to form a protective film hole 250a.

In this instance, the protective film hole 250a has a depth enough to expose a line such as the drain line on the substrate 200, and functions as a contact hole as the drain electrode exposed as the transparent metal is pattern and the pixel electrode are connected electrically in a later process.

A liquid crystal display device having the method for forming a micron pattern, the method for forming a micron channel, and the method for forming a micron hole applied thereto will be described.

Figure 15:
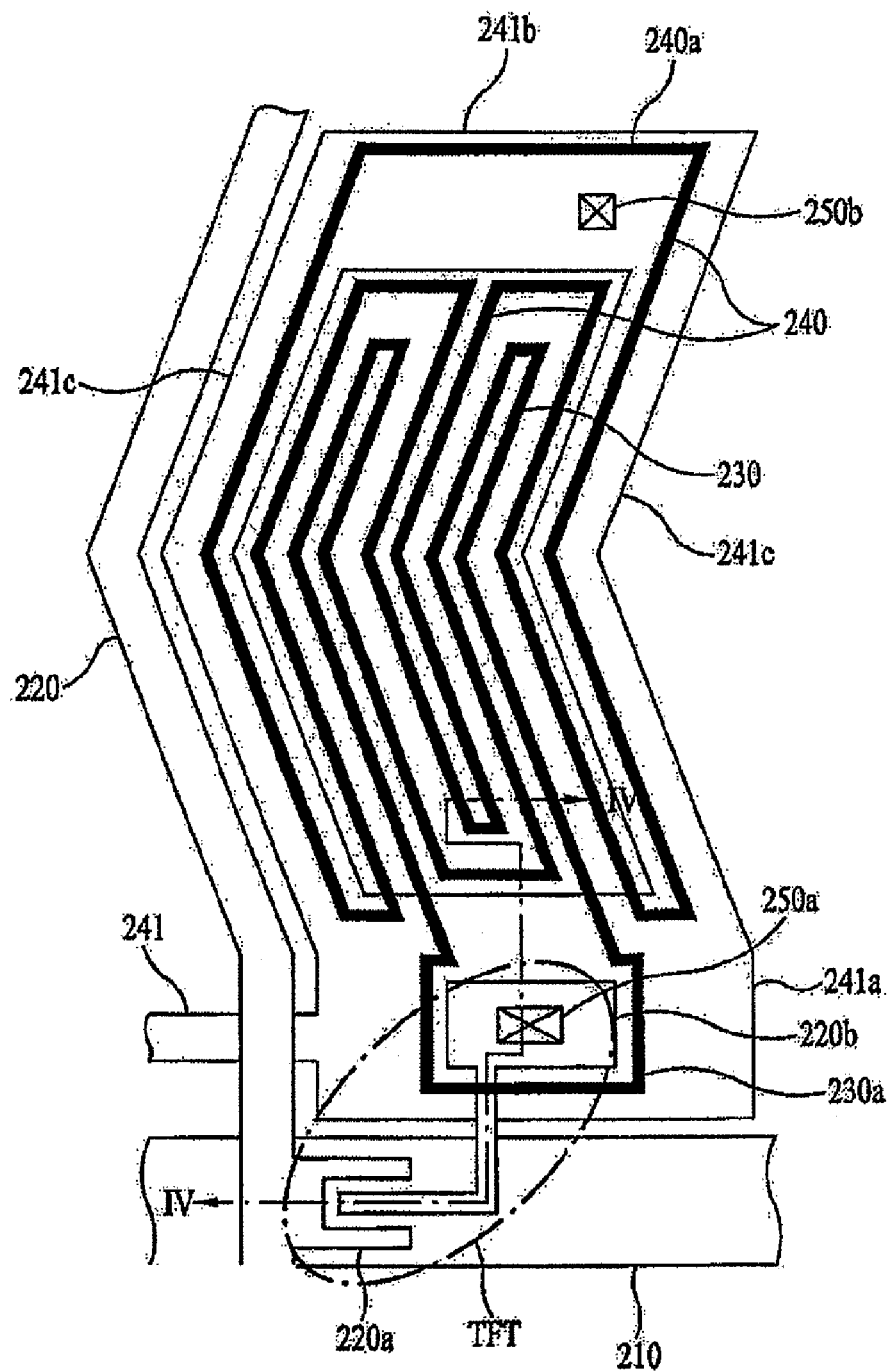
FIG. 15 illustrates a plan view of a liquid crystal display device applicable to a method for forming a micron pattern in accordance with a preferred embodiment of the present invention.
Figure 16:
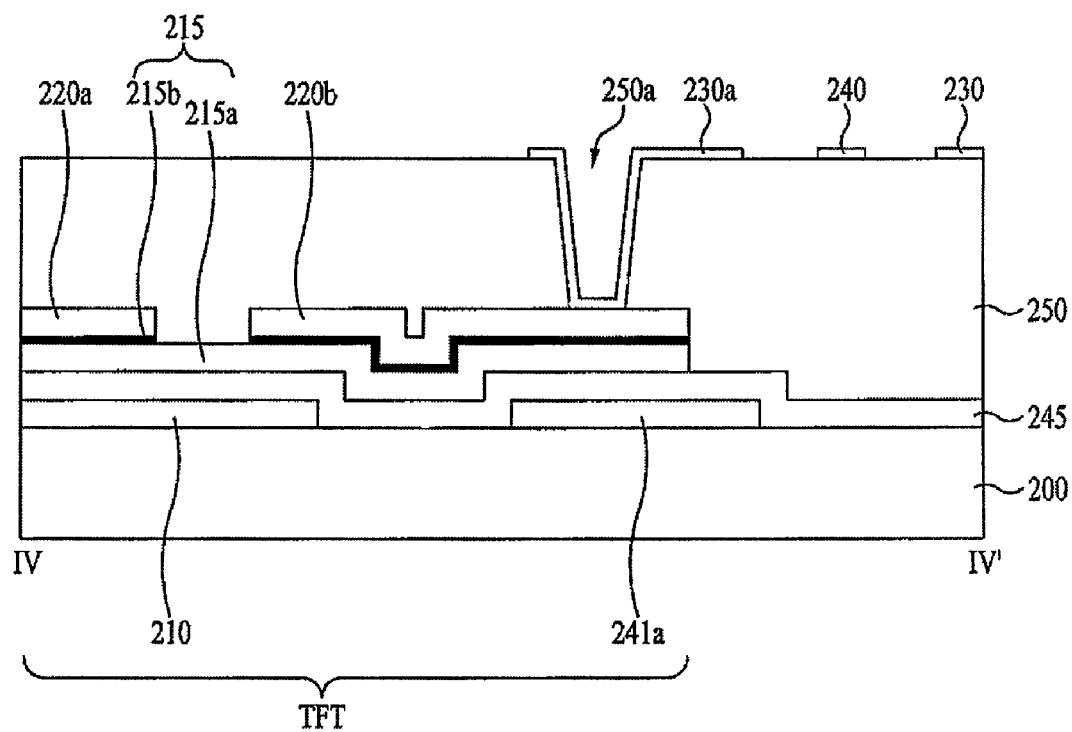
FIG. 16 illustrates a section across a line IV-IV' in FIG. 15.

FIG. 15 illustrates a plan view of a liquid crystal display device applicable to a method for forming a micron pattern in accordance with a preferred embodiment of the present invention, and FIG. 16 illustrates a section across a line IV-IV' in FIG. 15.

Referring to FIGS. 15 and 16, the liquid crystal display device includes a plurality of gate lines 210 and data lines 220 crossing each other on a substrate 200 to define pixel regions, thin film transistors TFT at crosses of the gate lines 210 and data lines 220, and pixel electrodes 230 and common electrodes 240 formed alternately at the pixel regions. The pixel regions, spaced from one another at fixed intervals, form a matrix, and the gate lines 210 and data lines 220 pass between the pixel regions, respectively.

The thin film transistor TFT includes gate line 210 having a gate electrode (a large width of the gate line is formed so that a width of the gate line at a cross of the gate line and the data line serves as the gate electrode), a source electrode 220a projected from the data line 220 to overlap with the gate line 210 in a C shape, and a drain electrode 220b in the C shape source electrode 220a on the gate line 210 spaced from the source electrode 220a. An island shape semiconductor layer 215 which covers the gate line is formed in contact with an underside of the source electrode 220a and the drain electrode 220b. The semiconductor layer 215 is a stack of an underlying amorphous silicon layer 215a and an overlying $n^+$ type impurity layer 215b. The C shaped source electrode 220a is formed for providing a C shaped channel between source electrode 220a and the drain electrode 220b for securing a large channel area. The channel may have various shapes including a '-' shape which is basic one, an L shape, and so on. The channel defined by using the methods for forming a channel described in one of FIGS. 10A to 10D, can be formed with a size below 4 μm, preferably, even below 2 μm.

There is a second storage electrode 230a formed to cross over the drain electrode 220b as one unit with the pixel electrode 230, additionally. The drain electrode 220b and the second storage electrode 230a are connected electrically through the first contact hole 250a.

The pixel electrode 230 and the drain electrode 220b are formed of a transparent metal, and can be formed as micron patterns each with a line width below 4 μm by the methods for forming a pattern described with reference to FIGS. 6A to 6C. In the meantime, the common electrodes 240 are formed as one unit with a second connection pattern 240a which connects the branched common electrodes 240. Thus, by forming the common electrodes 230 and the pixel electrodes 230 each to have a micron line width at the pixel regions, enabling to prevent an aperture loss caused by areas of the electrodes from becoming poor, the aperture can be improved.

Referring to FIGS. 4 and 8A to 8E, in this case, a mask for forming the pixel electrode 230 and the common electrode 240 has a structure with a bent middle portion in conformity with a portion for forming the pixel electrode 230 and the common electrode 240, and includes a supporting portion of a fixed line width, and a light shielding portion having an uneven portion with repetitive projections at a boundary of the supporting portion. The uneven portion may be projected outwardly from the supporting portion or recessed inwardly from the supporting portion. In a latter case, a pattern with a finer line width can be formed.

A common line 241 is formed parallel to the gate line 210, a first storage electrode 241a is formed to pass under the drain electrode 220b as one unit with the common electrode 241, a common light shielding pattern 241c is formed branched from the first storage electrode 241a opposite to opposite boundaries of the pixel regions in parallel to the data line 220, and a first connection pattern 241b is formed, which connects the opposite light shielding patterns 241c at the pixel region, additionally. The common line 241, the first storage electrode 241a, the first connection pattern 241b, and the common light shielding pattern 241b are formed of the same light shielding material, and on the same layer, with the gate line 210. The first connection pattern 241b and the second connection pattern 240b are connected with the second contact hole 250b.

In the meantime, formed at an interlayer between the gate line 210 and the semiconductor layer 215 which has not been described, there is a gate insulating film 245, and formed at the interlayer between the semiconductor layer 215 and the pixel electrode/common electrode 240, there is a protective film 250.

In this instance, the first and second contact holes 250a and 250b in the protective film 250 may be formed as the micron holes by the method described with reference to FIGS. 14A to 14C.

In this instance, by providing the gate insulating film 245 between a portion where the first storage electrode 241a and the second storage electrode 230a are overlapped, a storage capacitor can be defined.

In the meantime, though not shown, a color filter array is formed on a substrate opposite to the thin film transistor array substrate, including a black matrix layer, and a color filter layer, so that a picture can be displayed by alignment of liquid crystals between the opposite substrate and the substrate 200 by in-plane field driving between the common electrode 240 and the pixel electrode 230.

Above description is on the IPS type liquid crystal display device, wherein, other than the structure with the middle bent portion of the data line, the common electrode, and the pixel electrode, the data line, the common electrode, and the pixel electrode may have a structure formed perpendicular to the gate line, a zigzag structure within one pixel region, or other structures.

In addition to the IPS type liquid crystal display device, a liquid crystal display device of a TN (Twist Nematic) mode will be described.

Figure 17:
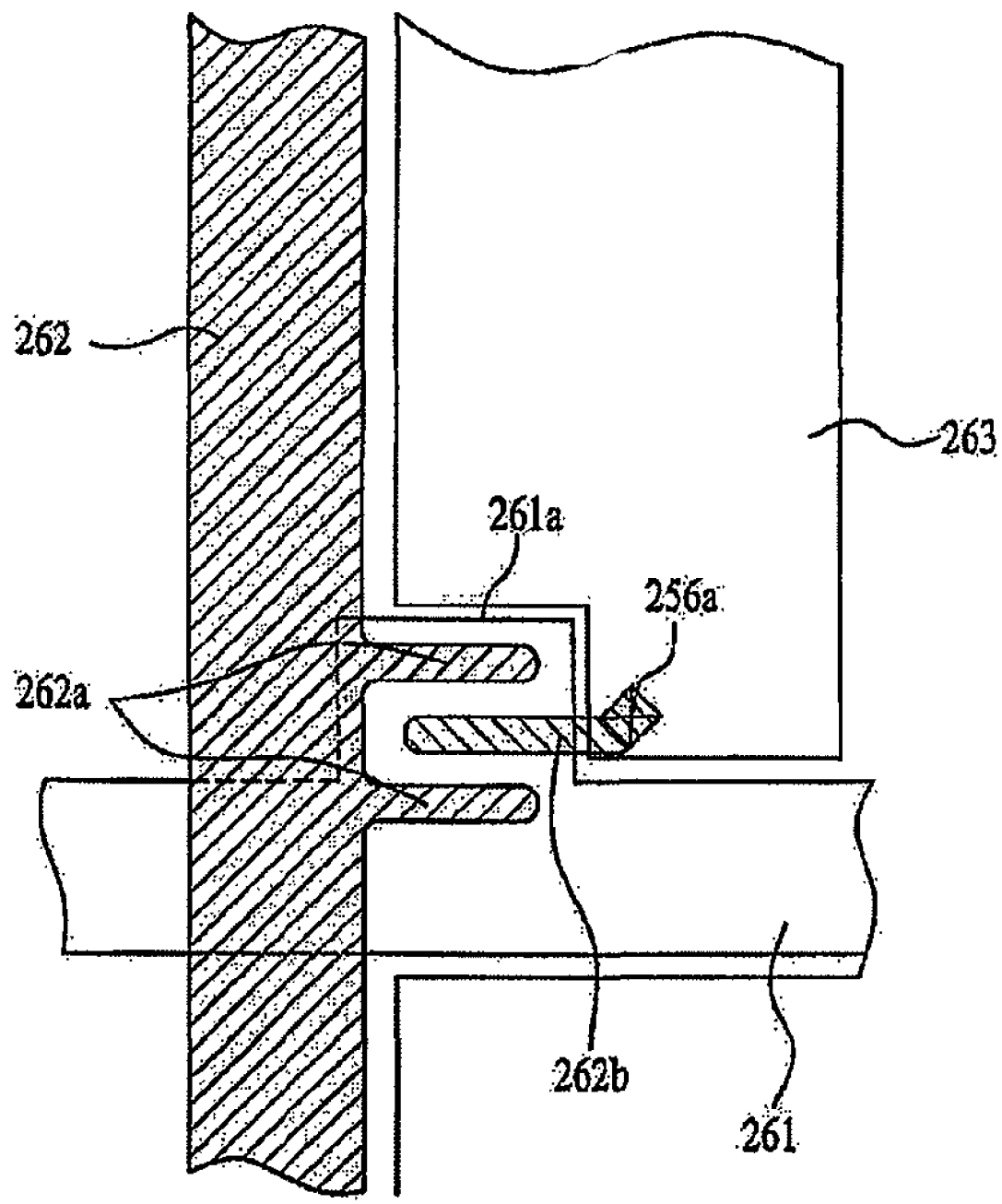
FIG. 17 illustrates a plan view of a liquid crystal display device having a method for forming a micron pattern in accordance with another preferred embodiment of the present invention applied thereto.

FIG. 17 illustrates a plan view of a liquid crystal display device having methods for forming a micron channel and a micron hole in accordance with another preferred embodiment of the present invention applied thereto.

Referring to FIG. 7, the liquid crystal display device includes a plurality of gate lines 261 and data lines 262 formed on a substrate 200 to cross each other to define pixel regions, thin film transistors TFT at the crossed portion of the gate lines 261 and data lines 262, and pixel electrodes 263 formed at the pixel regions.

The liquid crystal display device shown in FIG. 17 is similar to the IPS type liquid crystal display device shown in FIG. 15 excluding that the liquid crystal display device shown in FIG. 17 has a pixel electrode 263 formed at every pixel regions, and the common electrode is formed on the opposite substrate (not shown), and description of the similar structure will be omitted.

The thin film transistor TFT includes a gate electrode 261a projected from the gate line 261, a C shaped source electrode 262a crossed over the gate electrode 261a, a drain electrode 262b spaced from the source electrode 262a. In this instance, a region between the source electrode 262a and the drain electrode 262b is defined as the channel, which can be formed by the method described with reference to FIGS. 10A to 10D, and the protective film hole (contact hole) can also be formed by the method described with reference to FIGS. 14A to 14C.

Referring to FIGS. 15 and 16, though the method for forming a micron pattern is described with reference to methods for patterning a pixel electrode and a common electrode for improving aperture, the present invention is not limited to this, but even the gate line, the data line, or the common line can be patterned with a mask having a light shielding portion with an uneven portion for improving the aperture.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

As has been described, the exposing device, methods for forming a pattern, a channel, and a hole respectively, and a liquid crystal display device therewith and a method for fabricating the same of the present invention have the following advantages.

First, in general, the light used in fabrication of a liquid crystal display device, with a wavelength of 300 nm, has a limit in formation of a micron line width if a mask having a linear light shielding portion defined thereon is used.

Particularly, in a structure in which the common electrodes and the pixel electrodes are formed alternately at the pixel regions, alignment of the liquid crystals is difficult at portions over the electrodes to fail transmission of the light in areas as much as the electrodes occupy, thereby dropping the aperture. However, if the mask having the light shielding portion with the uneven portion that induces refraction of the light of the present invention is used in patterning, the common electrode and the pixel electrode each with a line width below 4 μm, preferably, below 2 μm can be formed, thereby improving an aperture.

Second, even if an exposing light source having a low resolving power is used, if a mask having an uneven portion defined at a channel corresponding portion is used, the patterning can be made better than the resolving power of the exposing light source, enabling to form a channel of a short length, electric mobility of the thin film transistor is enhanced, to increase a driving speed.

Third, in formation of a protective film hole for enabling contact between the drain electrodes or the pixel electrodes, or formation of a contact hole defined in the gate line terminal or the data line terminal for applying a gate line or data line signal, in general, the light used has a resolving power lower than the resolving power of the light used in formation of the channel. In this case, since the protective film hole or the contact hole has a very large aperture diameter with a width of about 10 μm, there are cases when a line width of a portion in which the protective film hole or the contact hole is to be formed is increased for forming the protective film hole or the contact hole therein, resulting in reduction of the aperture. Since the mask having the light shielding portion with uneven portion can form a micron hole with a diameter below 4 μm, the aperture can be improved at the end.

What is claimed is:

1. In a method for fabricating a liquid crystal display device comprising a gate line and a data line crossing each other to define a pixel region on a substrate, a thin film transistor including a gate electrode, a source electrode and a drain electrode on opposite sides of the gate electrode, and a semiconductor layer under the source/drain electrodes at a crossed portion of the gate line and the data line, and a protective film at the pixel region having a protective film hole between the pixel electrode and the drain electrode and the pixel region,
at least one of the gate line, the data line, the pixel electrode, a channel of the semiconductor layer, and the protective film hole is formed by a method comprising the steps of:
forming a thin film on a substrate;
coating a photoresist film on the thin film;
aligning a mask over the photoresist film,
the mask including:
a light shielding portion having a supporting portion and an uneven portion, and
a transmission portion defined at regions excluding the light shielding portion, wherein the light shielding portion has a greatest width of below 4 μm, and the supporting portion has a width of below 2 μm;
exposing the photoresist film with the mask thereon to a UV beam with a wavelength greater than 300 nm while causing refraction of the UV beam at the uneven portion and in the vicinity thereof, and developing the photoresist film exposed thus to form a photoresist film pattern with a width of below 2 μm; and
patterning the thin film by using the photoresist film pattern.

2. The method as claimed in claim 1, further comprising the step of forming the pixel regions and common electrodes alternating with the pixel electrode at the time of formation of the pixel electrodes.

3. The method as claimed in claim 2, further comprising the step of defining the mask at the time of formation of the pixel electrode and the common electrode,
the mask including a supporting portion of a line corresponding to the pixel electrode and the common electrode and an uneven portion on a boundary on an outside of the supporting portion.

4. The method as claimed in claim 3, wherein the light shielding portion including the supporting portion and the uneven portion for patterning the pixel electrode and the common electrode has a greatest width of 4 μm, and the supporting portion has a width below 2 μm.

5. The method as claimed in claim 1, wherein the mask includes the transmission portion defined in correspondence to the protective film hole, the uneven portion defined at the boundary of the transmission portion, and rest of regions of the mask defined as the light shield portion at the time the protective film hole is formed.

6. The method as claimed in claim 1, wherein the mask includes;
the light shielding portion having opposite supporting portions in correspondence to the channel forming portion and the uneven portion on a boundary of the supporting portion, and
the transmission portion on an outside of the light shielding portion.

* * * * *